United States Patent [15] 3,636,380
Anderson [45] Jan. 18, 1972

[54] POWER AMPLIFIER

[72] Inventor: Vernon A. Anderson, Boulder, Colo.

[73] Assignee: The United States of America as represented by the Secretary of the Navy

[22] Filed: Sept. 4, 1970

[21] Appl. No.: 69,680

[52] U.S. Cl. ..................................307/261, 307/290, 330/13
[51] Int. Cl. ..........................................H03k 5/00, H03f 3/18
[58] Field of Search ..............307/261, 290; 328/140; 330/13

[56] References Cited

UNITED STATES PATENTS

| | | | |
|---|---|---|---|
| 3,018,386 | 1/1962 | Chase | 307/290 X |
| 3,187,269 | 6/1965 | Runyan | 307/261 X |
| 3,205,445 | 9/1965 | Cubert | 307/261 X |
| 3,278,737 | 10/1966 | Germain | 307/261 X |

*Primary Examiner*—John S. Heyman
*Attorney*—R. S. Sciascia and Roy Miller

[57] ABSTRACT

An amplifier using a Schmitt trigger. When the amplifier provides a positive signal the input to the Schmitt trigger increases due to a feedback network. When the input signal becomes more positive than the voltage at the noninverting terminal, the Schmitt trigger reverses state and supplies a negative output. When the input, due to the feedback network, is more negative than the voltage at the noninverting terminal, the Schmitt trigger once again reverses state. An inductor and a capacitor function as a low-pass filter at the output.

2 Claims, 3 Drawing Figures

INVENTOR.
VERNON A. ANDERSON
BY
ROY MILLER
ATTORNEY.

POWER AMPLIFIER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The invention relates to the field of audio frequency power amplifiers used to drive direct current motors, or any DC load. Prior devices to accomplishing the above-mentioned results are class A or AB amplifiers or magnetic amplifiers. The inherent disadvantages are that the devices are not solid state or possess magnetic components which result in distortion, and they have higher quiescent power dissipation.

SUMMARY OF THE INVENTION

The present invention is a medium-current power amplifier using pulse width and pulse frequency modulation which can be utilized, as, for example, as a tuned power amplifier, a servoamplifier, or a gyrodrive amplifier.

The amplifier has a Schmitt trigger receiving a combined input signal. When the combined input signal is at a value above a predetermined level the Schmitt trigger reverses state. The output of the Schmitt trigger is amplified. The amplified signal is both fed back to be combined with the input signal and outputted to a filter. The filter output provides the system output.

DESCRIPTION OF THE PREFERRED EMBODIMENT

Figures 1, 2, 3:
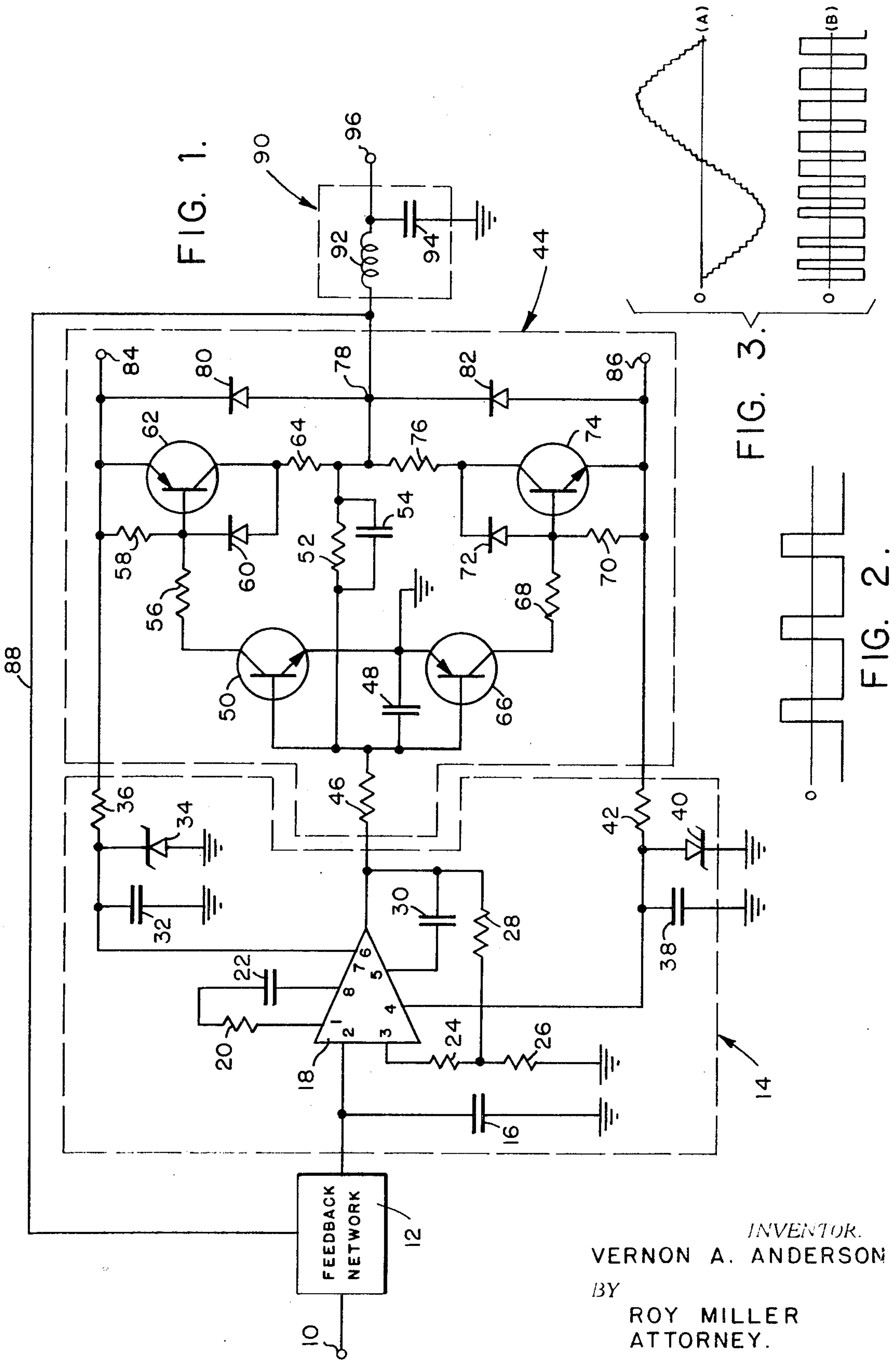
FIG. 1 is a schematic diagram of the invention.
FIG. 2 is the waveform output of the amplifier (at junction 78) for a positive input.
FIG. 3 (A and B) is the waveform output of the amplifier (at 96 and junction 78 respectively) for an alternating current input.

Referring to FIG. 1, the power amplifier comprises an input signal 10, a feedback network 12, a Schmitt trigger 14, a saturating amplifier circuit 44, a feedback connection 88, a low pass filter 90, and an amplifier output 96. The input signal 10 is combined with the signal from the feedback connection 88 in the feedback network 12. The feedback network output provides the input to the Schmitt trigger 14. When the Schmitt trigger input is above a voltage level determined by the selection of the Schmitt trigger components the Schmitt trigger 14 changes state. The Schmitt trigger output is amplified by amplifier circuit 44 and the amplified signal is both fed back, via feedback connection 88, and inputted to low pass filter 90.

The output of the feedback network 12, therefore, changes polarity and builds in value. When the input to the Schmitt trigger 14 exceeds a predetermined value of voltage the Schmitt trigger again reverses states. As a result, the output from the amplifier circuit 44 is a square wave.

More specifically the circuit operation is as follows; operational amplifier 18 and its associated components form Schmitt trigger 14. Therefore, the operational amplifier's output will be at either positive or negative saturation. The hysteresis width of the trigger is determined by the value of resistors 26 and 28. Transistors 50, 66, 62, and 74, with associated components, form saturating amplifier circuit 44 and amplify the output of the Schmitt trigger 14.

First consider the state wherein the output of the operational amplifier 18 is at positive saturation. If the components listed below are used, the output of the operational amplifier 18 will be amplified to approximately +25 volts at junction 78. Therefore capacitor 16, at the input to the Schmitt trigger 14, will be charging positive due to the feedback connection 88. As soon as the voltage on capacitor 16 exceeds the voltage at pin 3, the noninverting terminal of operational amplifier 18, the Schmitt trigger 14 will reverse state at the output and go to negative saturation. This voltage will be amplified by amplifier circuit 44 to approximately −25 volts at the junction 78 and will reverse the charging on capacitor 16 due to the feedback connection 88. Capacitor 16 will continue to charge negative until its voltage now becomes more negative than the voltage at pin 3 of the operational amplifier 18. The Schmitt trigger 14 at that time will then switch again to positive saturation, returning to its original state.

The rate at which the operational amplifier 18 is switched is determined by the charging rate of capacitor 16 and the hysteresis width of the Schmitt trigger 14. The hysteresis width is determined by the selection of resistors 26 and 28. The quiescent output of the circuit will be a square wave at junction 78.

For a positive input voltage (FIG. 2), capacitor 16 will charge positive faster and negative slower. Therefore the output of the operational amplifier 18 will be at negative saturation for a longer period of time than it will be at positive saturation.

The following list of components is provided by way of example only of the type and value of circuit components in the preferred embodiment of the invention.

| Symbol | Component | Type or value |
|---|---|---|
| 12 | Feedback network. | Any feedback network to give the desired transfer function. |
| 16 | Capacitor | Chosen to set oscillation frequency 81 kilohertz (determined by feedback network). |
| 18 | Operational amplifier. | μA709. |
| 20 | Resistor | 1.5 kilohm, ¼ watt. |
| 22 | Capacitor | 10 picofarad. |
| 24 | Resistor | Chosen to equalize the impedance looking from the inverting and non-inverting inputs of the operational amplifier (determined by feedback network). |
| 26 | do | 10 ohm, ¼ watt. |
| 28 | do | 20 kilohm, ¼ watt. |
| 30 | Capacitor | 3 picofarad. |
| 32 | do | 0.01 microfarad. |
| 34 | Zener diode | 1N962B. |
| 36 | Resistor | 1 kilohm, 1 watt. |
| 38 | Capacitor | 0.01 microfarad. |
| 40 | Zener diode | 1N962B. |
| 42 | Resistor | 1 kilohm, 1 watt. |
| 46 | do | 2 kilohm, ¼ watt. |
| 48 | Capacitor | 0.015 microfarad. |
| 50 | Transistor | 2N2222A. |
| 52 | Resistor | 10 kilohm, ¼ watt. |
| 54 | Capacitor | 470 picofarad. |
| 56 and 68 | Resistor | 240 ohm, 3 watts. |
| 58 and 70 | do | 100 ohm, ¼ watt. |
| 60 and 72 | Diode | PD9950 with 0.6 volt maximum at 100 milliamperes. |
| 62 | Transistor | 2N3868 with VCEO=80 volts. |
| 64 and 76 | Resistor | 4.99 ohm, 3 watts. |
| 66 | Transistor | 2N2907A. |
| 74 | do | 2N3507 with VCEO=80 volts. |
| 80 and 82 | Diode | PD9950. |
| 84 | Supply voltage | +25 volt d.c. |
| 86 | do | −25 volt d.c. |
| 92 | Inductor | 15 millihenry, 2.5 ohm. |
| 94 | Capacitor | 0.68 microfarad. |

The square-wave output at junction 78 is attenuated so that only the fundamental square-wave frequency is seen at the output 96 (FIG. 3).

What is claimed is:

1. An electronic amplifier comprising:

an electrical input signal;

means for providing a square wave signal from said input signal;

means for amplifying said square wave signal; and means for altering a portion of said amplified square wave signal and providing said altered portion as an output;

wherein said square wave providing means comprises an electrical circuit coupled to said amplified square wave signal and a Schmitt trigger circuit for feeding back a portion of said amplified square wave signal to the input of said Schmitt trigger; and said Schmitt trigger including an operational amplifier having first and second input terminals a storage capacitor for accumulating an electrical charge dependent on said electrical input and feedback signals, and said second terminal is coupled to said square wave signal such that when the voltage at said second terminal is positive and the voltage at said first terminal becomes more positive than the voltage at the second terminal the Schmitt trigger changes state, and when the voltage at said second terminal is negative and the voltage at said first terminal becomes more negative than the voltage at the second terminal the Schmitt trigger changes state.

2. The amplifier of claim 1 wherein said amplifying means comprises;

a complementary symmetry, direct-coupled driver amplifier having a common-emitter first stage and a common-collector second stage wherein one transistor of said first stage is in saturation when the other is cut off and one transistor of said second stage is in saturation when the other is cut off, such that when a transistor of said first stage is in saturation its direct-coupled driver of said second stage is in saturation.

* * * * *